United States Patent
Hammerschmidt et al.

(10) Patent No.: US 9,467,774 B2
(45) Date of Patent: Oct. 11, 2016

(54) SYSTEM AND METHOD FOR A PCM INTERFACE FOR A CAPACITIVE SIGNAL SOURCE

(75) Inventors: Dirk Hammerschmidt, Villach (AT); Michael Kropfitsch, Koettmannsdorf (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 532 days.

(21) Appl. No.: 13/370,920

(22) Filed: Feb. 10, 2012

(65) Prior Publication Data

US 2013/0208915 A1  Aug. 15, 2013

(51) Int. Cl.
*H04R 3/00* (2006.01)
*H03M 3/00* (2006.01)
*H04R 19/04* (2006.01)
*H04R 19/00* (2006.01)
*H04R 19/01* (2006.01)

(52) U.S. Cl.
CPC ............ *H04R 3/00* (2013.01); *H03M 3/424* (2013.01); *H04R 19/005* (2013.01); *H04R 19/016* (2013.01); *H04R 19/04* (2013.01); *H04R 2460/03* (2013.01); *H04R 2499/11* (2013.01)

(58) Field of Classification Search
CPC ........ H04R 3/00; H04R 1/04; H04R 19/016; H04R 19/04; H04R 2410/00; H03M 1/12; H03M 1/50; H03M 1/504–1/508; H03M 1/60–1/62
USPC ............... 341/155, 126; 330/10, 251, 207 A; 381/111–117, 122, 91, 92, 174, 175; 375/238, 242

See application file for complete search history.

(56) References Cited

U.S. PATENT DOCUMENTS

| | | |
|---|---|---|
| 4,238,783 A | 12/1980 | Miller |
| 5,051,799 A | 9/1991 | Paul et al. |
| 5,399,989 A | 3/1995 | Chern |
| 5,598,353 A | 1/1997 | Heyl |
| 5,886,656 A | 3/1999 | Feste et al. |
| 5,896,101 A | 4/1999 | Melanson |
| 6,028,946 A | 2/2000 | Jahne |
| 6,087,968 A | 7/2000 | Roza |
| 6,198,417 B1 | 3/2001 | Paul |
| 6,326,912 B1 | 12/2001 | Fujimori |
| 6,686,833 B2 * | 2/2004 | Takahashi ............... G08B 6/00 340/384.1 |

(Continued)

FOREIGN PATENT DOCUMENTS

| | | |
|---|---|---|
| CN | 1879446 A | 12/2006 |
| EP | 1788553 A1 | 5/2007 |
| WO | 2009135815 | 11/2009 |

OTHER PUBLICATIONS

"LM231A/LM231/LM331A/LM331 Precision Voltage-to-Frequency Converters," National Semiconductor Corporation, 2006, pp. 17.

(Continued)

*Primary Examiner* — Xu Mei
(74) *Attorney, Agent, or Firm* — Slater Matsil, LLP

(57) ABSTRACT

In accordance with embodiment, a method includes amplifying signal provided by a microphone to form an amplified signal. The method also includes converting the amplified signal into a frequency-based signal having a frequency dependent on an amplitude of the amplified signal. The frequency-based signal is converted into a pulse code modulated bitstream.

11 Claims, 8 Drawing Sheets

(56) References Cited

U.S. PATENT DOCUMENTS

| | | | |
|---|---|---|---|
| 6,703,878 B2* | 3/2004 | Soumyanath | H03L 7/093 327/156 |
| 6,809,676 B1* | 10/2004 | Younis | H03M 1/60 341/157 |
| 6,937,738 B2 | 8/2005 | Armstrong et al. | |
| 6,958,717 B1 | 10/2005 | Minogue | |
| 7,274,716 B2 | 9/2007 | Hochschild | |
| 7,630,504 B2 | 12/2009 | Poulsen | |
| 8,085,946 B2 | 12/2011 | Carreras et al. | |
| 8,610,497 B2 | 12/2013 | Kropfitsch et al. | |
| 2003/0155966 A1 | 8/2003 | Harrison | |
| 2003/0223592 A1 | 12/2003 | Deruginsky et al. | |
| 2003/0235315 A1 | 12/2003 | Reesor | |
| 2007/0127761 A1* | 6/2007 | Poulsen | H03M 7/3015 381/355 |
| 2008/0180299 A1* | 7/2008 | Forejt | H03M 1/504 341/166 |
| 2008/0212791 A1* | 9/2008 | Asada et al. | 381/71.6 |
| 2011/0142261 A1 | 6/2011 | Josefsson | |

OTHER PUBLICATIONS

Delbrueck, T., et al., "Analog VLSI Adaptive, Logarithmic, Wide-Dynamic-Range Photoreceptor," Dept. of Computation and Neural Systems, California Institute of Technology, May 1994, 4 pages.

Feng, P., et al., "History of the High-Voltage Charge Pump," Book Excerpt, Nov. 2006, pp. 1-9, Chapter 1, Professional Engineering 6X9, Charge Pump Circuit Design.

Harrison, R. R., et al., "A Low-Power Low-Noise CMOS Amplifier for Neural Recording Applications," IEEE Journal of Solid-State Circuits, Jun. 2003, pp. 958-965, vol. 38, No. 6.

Harrison, R.R., "Integrated Circuits for Neural Interfacing," Circuits for Emerging Technologies, Feb. 15, 2008, pp. 1-12.

Vittoz, E., et al., "CMOS Analog Integrated Circuits Based on Weak Inversion Operation," IEEE Journal of Solid State Circuits, vol. SC-12, No. 3, Jun. 1977, pp. 224-231.

Soell, S., et al., "A VCO Based Digital Microphone Utilizing a FIR Sigma Delta Converter," International Conference Mixed Design (MIXDES), Gdynia, Poland, Jun. 22-24, 2006, 5 pages.

* cited by examiner

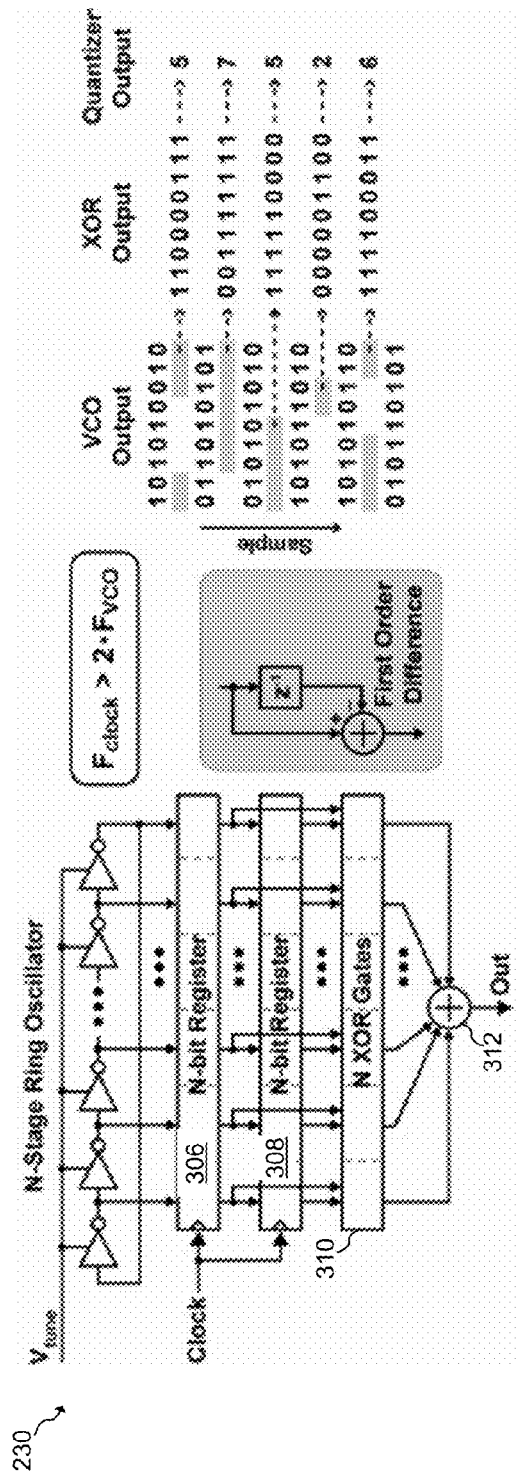
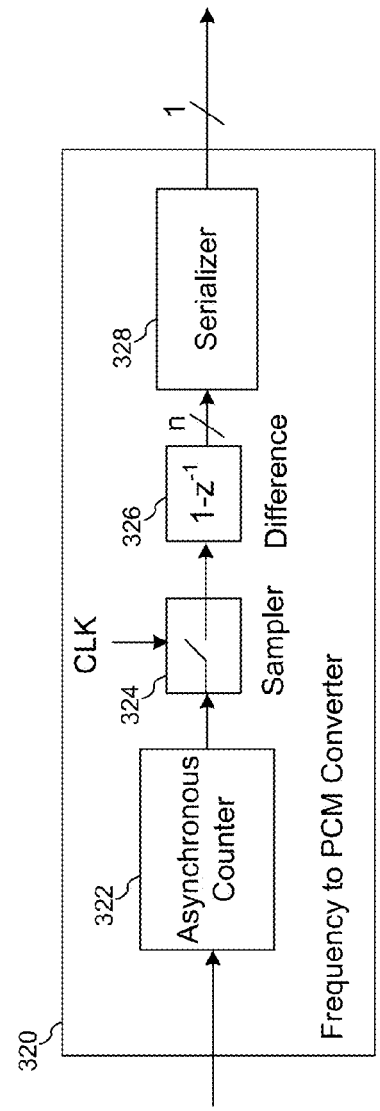
Fig. 3b
Fig. 3c

US 9,467,774 B2

SYSTEM AND METHOD FOR A PCM INTERFACE FOR A CAPACITIVE SIGNAL SOURCE

TECHNICAL FIELD

This invention relates generally to semiconductor circuits and methods, and more particularly to a pulse code modulation (PCM) interface for a capacitive signal source.

BACKGROUND

Audio microphones are commonly used in a variety of consumer applications such as cellular telephones, digital audio recorders, personal computers and teleconferencing systems. In particular, lower-cost electret condenser microphones (ECM) are used in mass produced cost sensitive applications. An ECM microphone typically includes a film of electret material that is mounted in a small package having a sound port and electrical output terminals. The electret material is adhered to a diaphragm or makes up the diaphragm itself. Most ECM microphones also include a preamplifier that can be interfaced to an audio front-end amplifier within a target application such as a cell phone. Another type of microphone is a microelectro-mechanical Systems (MEMS) microphone, which can be implemented as a pressure sensitive diaphragm is etched directly onto an integrated circuit.

In applications where MEMS microphones are implemented in small form factor packages such as smartphones or tablet computers, an audio interface using a minimum number of pins is used. One such interface is a pulse code modulated interface (PCM) that produces a PCM signal having a pulse width or pulse density proportional to the audio signal sensed by the MEMS microphone. It is also the case small form factor applications are often low-power, battery operated device that are sensitive to power consumption. In order to maintain a long battery life, the power consumption of the MEMS microphone and its board level audio interface is minimized in order to conserve battery life.

SUMMARY OF THE INVENTION

In accordance with embodiment, a method includes amplifying signal provided by a microphone to form an amplified signal. The method also includes converting the amplified signal into a frequency-based signal having a frequency dependent on an amplitude of the amplified signal. The frequency-based signal is converted into a pulse code modulated bitstream.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3*a-d* illustrate frequency to PCM converters for use in an embodiment microphone interface system;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an interface system and method for a capacitive signal source such as a MEMS or an electret condenser microphone (ECM). The invention may also be applied, however, to other types of circuits and systems, such as audio systems, communication systems, sensor systems and other systems that interface to high impedance signal sources.

Figure 1A:
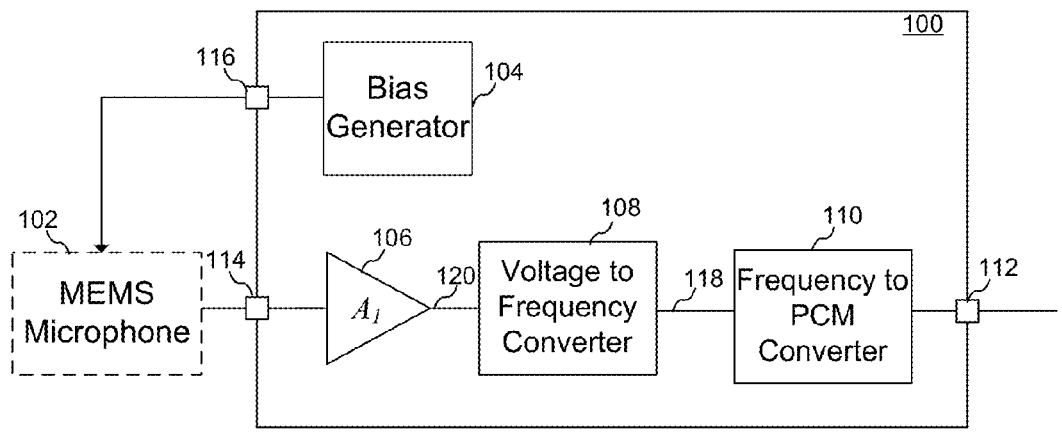
FIGS. 1*a-b* illustrate a microphone interface system according an embodiment of the present invention.

FIG. 1*a* illustrates embodiment integrated circuit (IC) 100 configured to be coupled to MEMS microphone 102, which is shown in dotted lines to indicate that microphone 102 is not necessarily included on IC 100. In some embodiments, however, microphone 102 may also be included on IC 100. In alternative embodiments, other microphone types, such as ECM microphones, or other types of capacitive sensor circuits may be used in place of MEMS microphone 102.

IC 100 has amplifier 106, voltage-to-frequency converter 108 and frequency to PCM converter 110. Amplifier 106 has one or more stages that amplify the output of MEMS microphone 102 coupled to IC 100 via input pad 114. In some embodiments, amplifier 106 may be implemented, for example, as described in co-pending application Ser. No. 13/183,193, entitled System and Method for Capacitive Signal Source Amplifier, filed on Jul. 14, 2011, which application has been incorporated by reference herein in its entirety. Alternatively, amplifier 106 may be implemented according to techniques known in the art.

In some embodiments, for example in embodiments using a MEMS microphone, bias generator 104 provides a bias voltage for microphone 102 itself at pin 116. In some embodiments, this bias voltage may be between about 3V and about 60V depending on the particular microphone and system implementation. Alternatively, other voltage ranges may be used. In further embodiments, bias generator 104 may be omitted if microphone or sensor 102 does not require a bias voltage or if the required bias voltage is provided elsewhere. It should be further appreciated that the components on IC 100 may be implemented using more than one component and/or more than one IC in alternative embodiments.

Figure 1B:
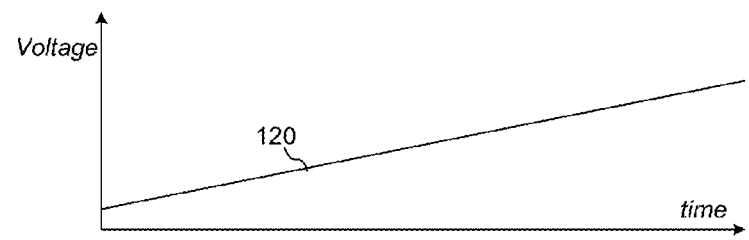
Figure 1B:
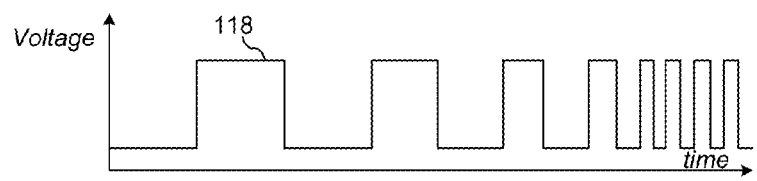

Voltage-to-frequency converter 108 converts the output voltage 120 of amplifier 106 to frequency signal 118, and frequency is 110 converts frequency signal 118 to a PCM signal for transmission on port 112. In some embodiments frequency signal 118 is a digital pulse signal having a frequency that is proportional or inversely proportional to output voltage 120 of amplifier 106 as shown in FIG. 1*b*.

Alternatively, signal 118 may be a variable frequency sinusoid, square wave, or other waveform having a frequency that is based on output voltage 120 of amplifier 106. In further alternative embodiments, the voltage to frequency converter 108 may produce a pulse density modulated waveform having a pulse density that is proportional or inversely proportional to an output voltage 120 of amplifier 106.

Figure 2A:
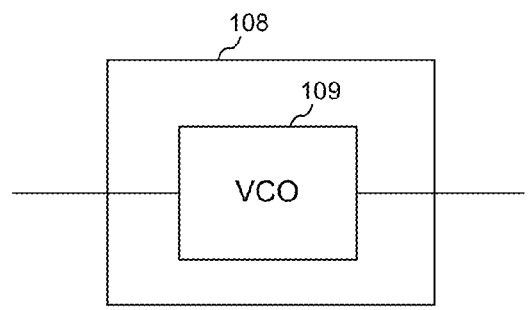
FIGS. 2*a-d* illustrate voltage controlled oscillators for use in an embodiment microphone interface system.
Figure 2B:
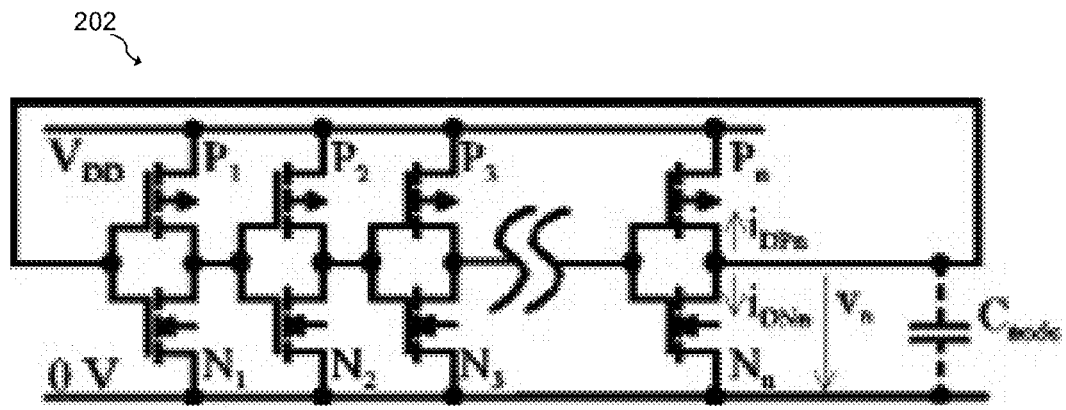

Voltage to frequency converter 108 may be implemented by voltage controlled oscillator 109 as shown in FIG. 2a. VCO 109 may be implemented using circuits and methods known in the art, for example, using a ring oscillator, relaxation oscillator, or other type of oscillator. In some embodiments, the input and/or output of VCO 109 may be a differential signal. As an example, FIG. 2b illustrates a CMOS ring oscillator 202 having a plurality of inverter stages that may be used in embodiment system implementations. The frequency of ring oscillator 202 may be controlled, for example, by changing supply voltage VDD.

Figure 2C:
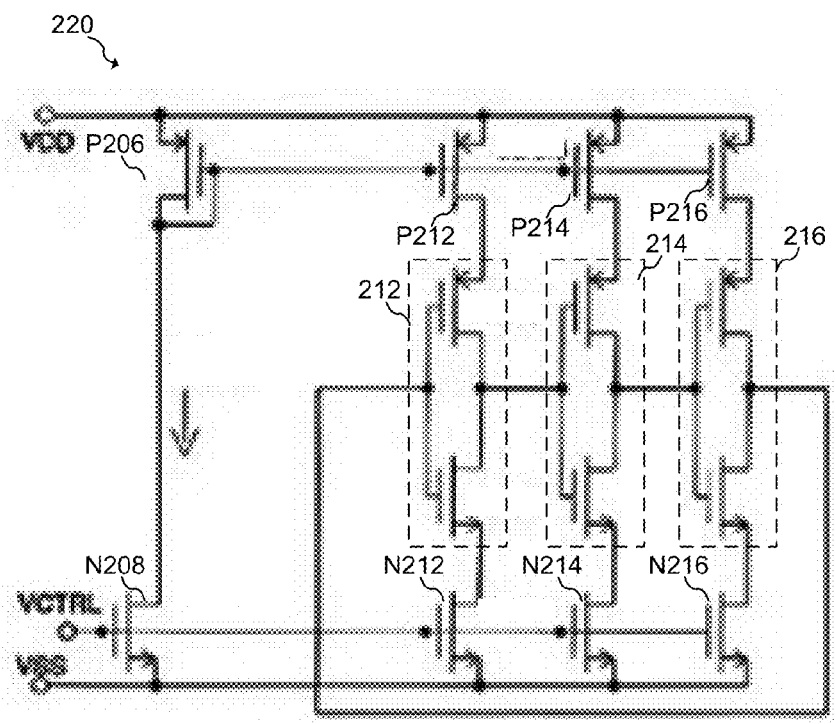
Figure 2D:
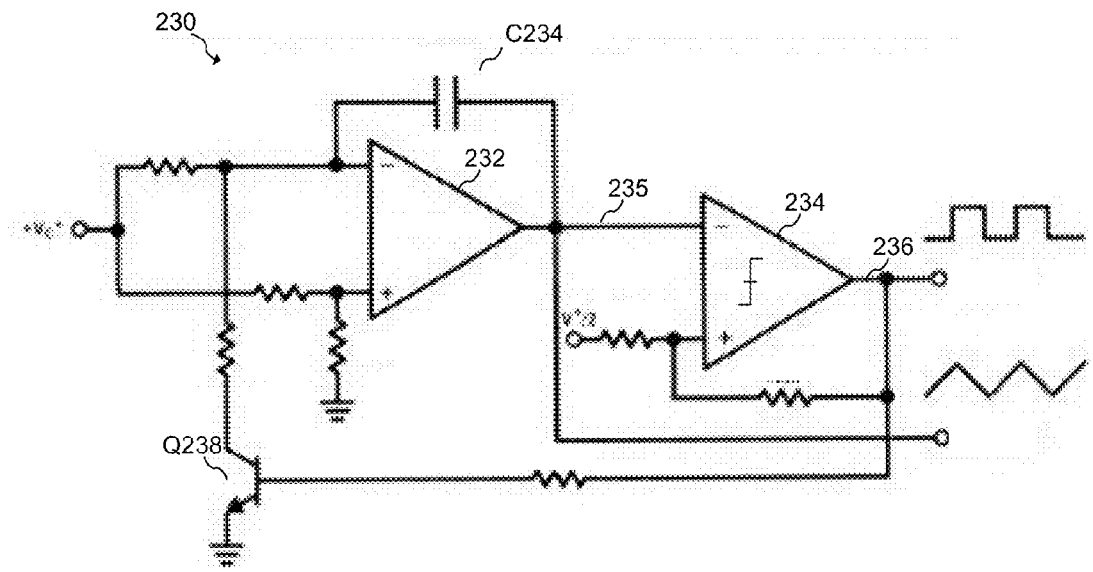

FIG. 2c illustrates ring oscillator 220 using a three current starved inverter stages 212, 214 and 216 that may be used to implement an embodiment voltage to frequency converter. Alternatively, greater or fewer stages may be used. The frequency of ring oscillator 220 is proportional to voltage VCTRL applied to NMOS device N208. As the voltage on the gate of N208 increases, the currents through transistors N208, P206, P204 and N210 correspondingly increases. This increased current is mirrored to inverter stages 212, 214 and 216 via transistors N212, P212, N214, P214, N216 and P216, thereby increasing the frequency of oscillator 220.

In an alternative embodiment, relaxation oscillator circuit 230 may be used to implement an embodiment voltage to frequency converter. Relaxation oscillator 230 has operational amplifier 232 and capacitor C234 coupled in an integrator configuration that produces saw-tooth signal 235. Oscillator 230 also has comparator 234 that monitors the output of operational amplifier 232 and produces frequency modulated pulse signal 236. The frequency of oscillator 230 is dependent upon voltage Vc applied to the inputs of operational amplifier 232. Transistor Q238 may be implemented as a CMOS device in some embodiments. It should be appreciated that the VCO circuits depicted in FIGS. 2a-d are only specific examples of many types of oscillators that may be used to implement embodiment systems.

Figure 3A:
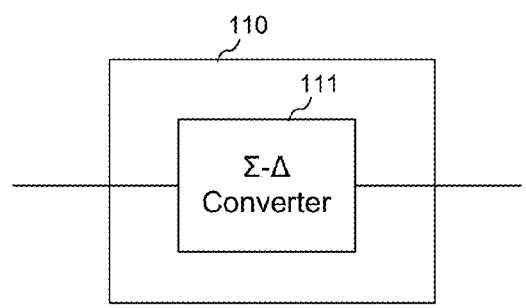

In an embodiment, frequency to PCM converter 110 may be implemented using sigma-delta converter 111 as shown in FIG. 3a. Sigma-delta converter 111 may be implemented using various known sigma-delta converter circuits and methods known in the art.

In an embodiment frequency to PCM converter, a measure of information may be obtained by counting the zero crossings of the output signal for a given reference time. The result of this count is proportional to the average frequency within this given reference time. Such a measurement may also quantize the information to produce a count having an integer number of zero crossings. In some embodiments, this quantization error is made lower by choosing a high oscillation frequency and/or by using an additional time to digital converter to measure the quantization error at a cost of higher power consumption. In one embodiment, power is saved by applying noise shaping techniques, while maintaining a "large" quantization error. One way to achieve such a property is to make sure the counting of the zero crossings is not stopped at any time, but the counter value is evaluated at fixed time instants such that the output of the frequency over time is the difference of two consecutive counter values. Such a method provides a first order quantization noise shaping.

FIG. 3b illustrates a frequency to PCM converter 302 according to a further embodiment. Instead of evaluating a single output of the VCO with a single counter, the polyphase nature of a ring oscillator 304 is used. In an embodiment, multiple outputs of ring oscillator 304 are evaluated by loading successive states of all ring oscillator output into registers 306 and 308. The difference of these sampled oscillator states is generated by exclusive-OR gates 310 and summed using summing 312 node. The difference of two sampled state (generated by the ex-or function) is proportional to the momentary frequency. Again, the quantization error is first order noise shaped. It should be appreciated that the circuit of FIG. 3b is just one example of many possible embodiment frequency to PCM converters that may be used in embodiment systems.

In an embodiment, the output of frequency to PCM converter 110 is a single bit pulse code modulated signal 112 as shown in FIG. 1a. In alternative embodiments of the present invention, frequency to PCM converter 110 may be implemented by sampling frequency modulated signal 118 with a clock signal and perform digital signal conditioning to produce PCM signal 112. In another embodiment, feedback signals may be coupled from frequency-to-PCM converter 110 to the microphone in order to improve system performance.

FIG. 3c illustrates frequency to PCM converter 320 according to another embodiment of the present invention in which a digital sigma-delta noise-shaper is used to convert multi-bit digital data to single-bit digital data. Frequency to voltage converter 320 has asynchronous counter 322, sampler 324, difference block 326 and serializer block 328. In an embodiment, the output of difference block 326 is an n-bit multi-bit output. Serializer block 328 may be implemented using a digital sigma-delta converter. Here, the result of a VCO analog to digital conversion may be a multi-bit data stream.

Figure 3D:
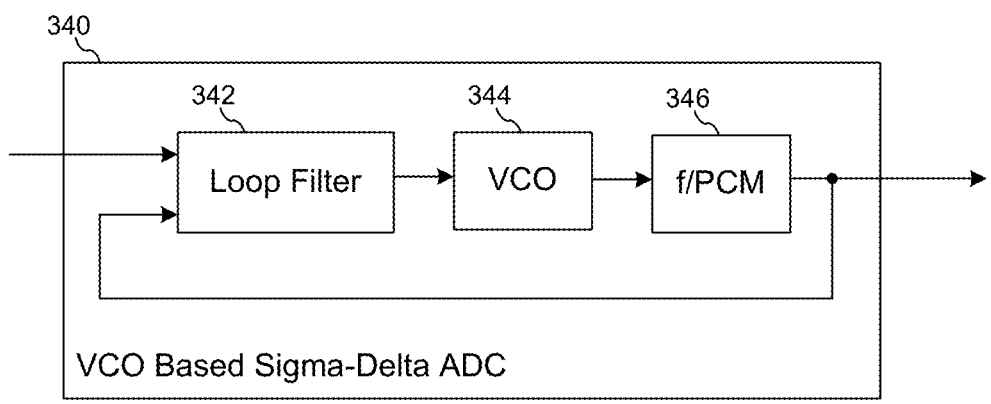

In a further embodiment, a frequency to PCM converter is implemented using a voltage/frequency based ADC inside a feed-back structure. In such an embodiment, the multi-bit output of a frequency measurement block is serialized to a one bit output stream, which is then fed back to an analog input. The difference is fed into an analog filter, the output of which is coupled to the voltage to frequency converter. This structure is known in the literature as "VCO based sigma-delta ADC," as illustrated in FIG. 3d. Here, VCO based sigma-delta ADC 340 has loop filter 342, VCO 344 and frequency to PCM converter 346. In an embodiment, the output of frequency to PCM block 346 is fed back to an input of loop filter 342. In an embodiment, frequency to PCM block 346 includes a serializer.

Figure 4A:
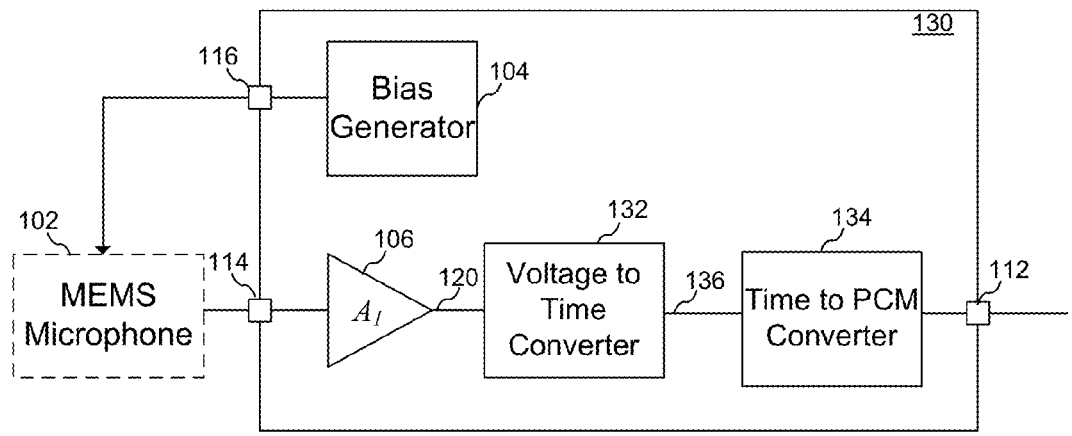
FIGS. 4*a-b* illustrate a microphone interface system according a further embodiment of the present invention.
Figure 4B:
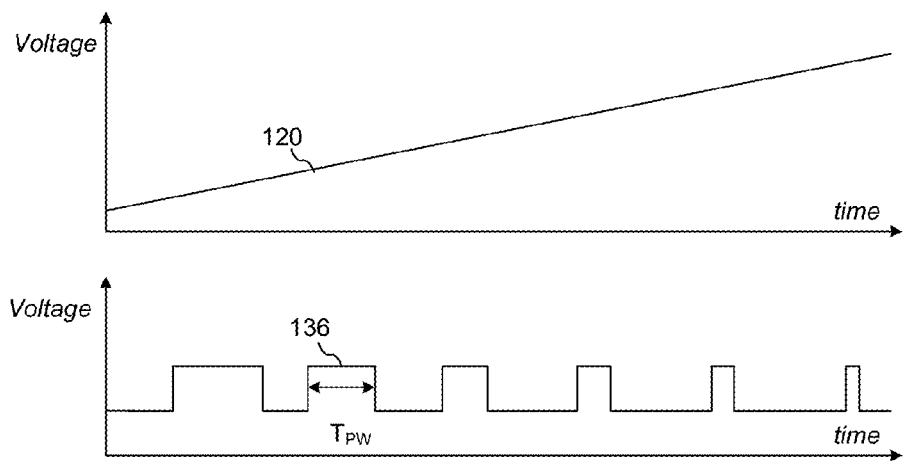

FIG. 4a illustrates embodiment integrated circuit 130 configured to be coupled to MEMS microphone 102. Integrated circuit 130 is similar to integrate circuit 100 shown in FIG. 1a, except that PCM signal at output 112 is produced by voltage to time converter 132 followed by time to PCM converter 134. In an embodiment, voltage to time converter 132 converts output 120 of amplifier 106 to time modulated signal 136. Time to PCM converter 134, in turn, converts time modulated signal 136 to PCM signal 112. In an embodiment, time modulated signal 136 may be a pulse width modulated signal as illustrated in FIG. 4b. Here, pulse width $T_{PW}$ is proportional to an output voltage 120 of amplifier 106. As shown in FIG. 4b, as the voltage of output voltage 120 increases pulse width $T_{PW}$ decreases. Alternatively, $T_{Pw}$ may increase with increasing output voltage 120 of amplifier 106.

Figure 5A:
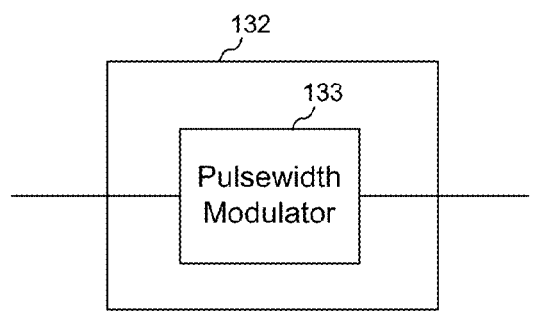
FIGS. 5*a-c* illustrate voltage to time converters for use in embodiment systems.

In accordance with an embodiment, voltage to time converter 132 may be implemented using pulse width modulator 133 as shown in FIG. 5a. Pulse width modulator 133 may be implemented using circuits and methods known in the art for producing a pulse width modulated signal. In some embodiments, pulse width modulator 133 may be implemented using various circuits.

Figure 5B:
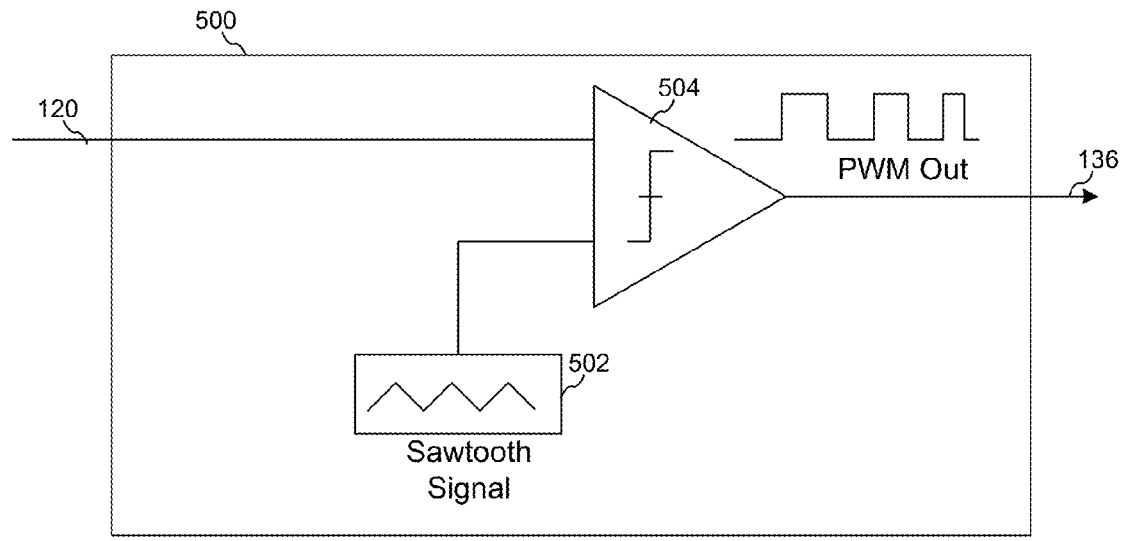

FIG. 5b illustrates pulse width modulator 500 that may be used in an embodiment of the present invention. Here a triangular or saw-tooth signal 502 as a reference and compared to input signal 120 using comparator 504 to produce PWM signal 136 having. In one embodiment, PWM signal 136 is a continuous time, discrete amplitude signal in which timing information of the input signal is coded as difference between high-time and low-time. Other circuits and approaches may be used in alternative embodiments, for example, a self-oscillating PWM generator input no reference signal is provided.

Figure 5C:
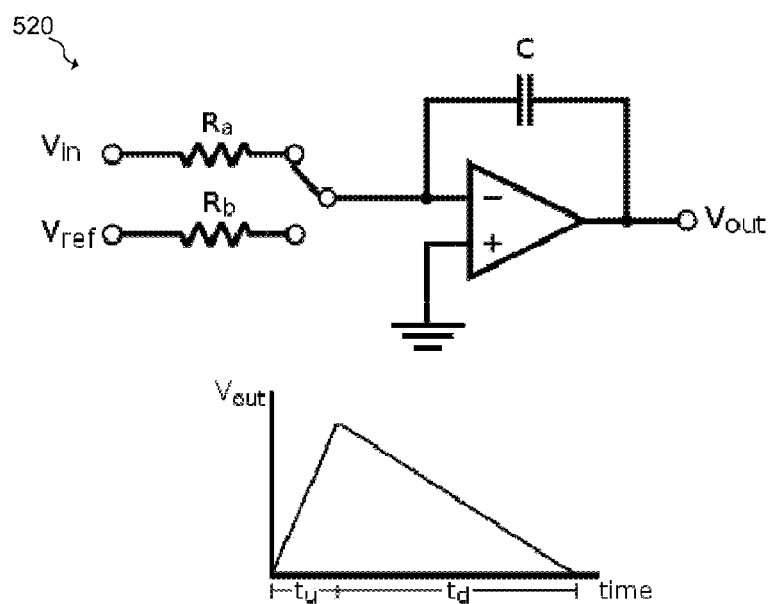

Alternatively, pulse width modulator 133 may be implemented using dual slope techniques using dual slope converter 520 shown in FIG. 5c in which time is used as a conversion reference. Here, input signal Vin is integrated for a certain given time $t_u$. The integrator is discharged thereafter with a given known reference voltage until the output reaches zero. The time it takes to discharge the integrator $t_d$ is measured. In an embodiment, $t_d$ is proportional to input voltage Vin.

Figure 6A:
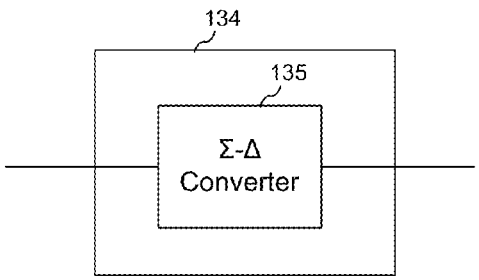
FIGS. 6*a-b* illustrate time to PCM converters for use in embodiment systems.

In an embodiment, time to PCM converter 134 may be implemented using sigma-delta converter 135 as shown in FIG. 6a. Sigma-delta converter 135 may be implemented using various known sigma-delta converter circuits and methods known in the art. In an embodiment, the output of frequency to PCM converter 110 is a single bit pulse code modulated signal 112 as shown in FIG. 4a. In alternative embodiments of the present invention frequency to PCM converter 134 may be implemented by sampling time modulated signal 136 with a clock signal and perform digital signal conditioning to produce PCM signal 112. In another embodiment, delay cells may be utilized to produce PCM signal 112. For example, in one embodiment a time to digital converter has a plurality of cascaded delay cells. During operation, the number of delay cells through which a pulse travels is measured between pulse edges.

Figure 6B:
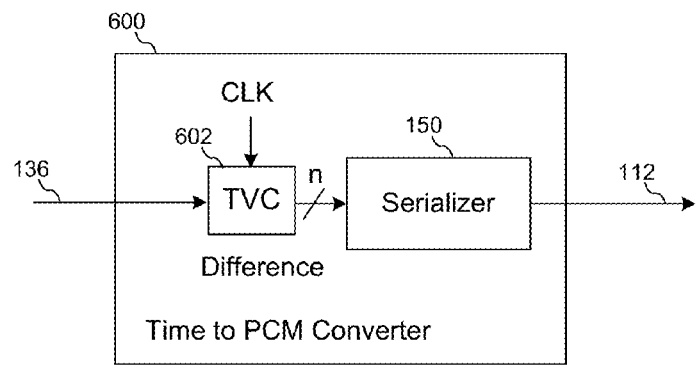

FIG. 6b illustrates embodiment time to digital converter 600 that utilizes time to voltage converter 602 and serializer 604 that may be implemented using a digital sigma delta converter. Here, PWM signal 136 may be digitized by measuring the high-time, measuring the low-time and calculating the difference between the high-time and the low time. Alternatively, if the PWM has a constant known frequency, either the high-time or the low-time may be measured, and the corresponding low-time or high-time may be calculated using the known frequency. In an embodiment, measurement of this time may be performed using a clocked counter or using a time-to-digital (TDC) converter, for example, in the case of very short pulses. In some embodiments, the output of the TDC is converted from a multi-bit format to a single bit format using a sigma-delta noise shaper such as serializer 604.

Figure 7:
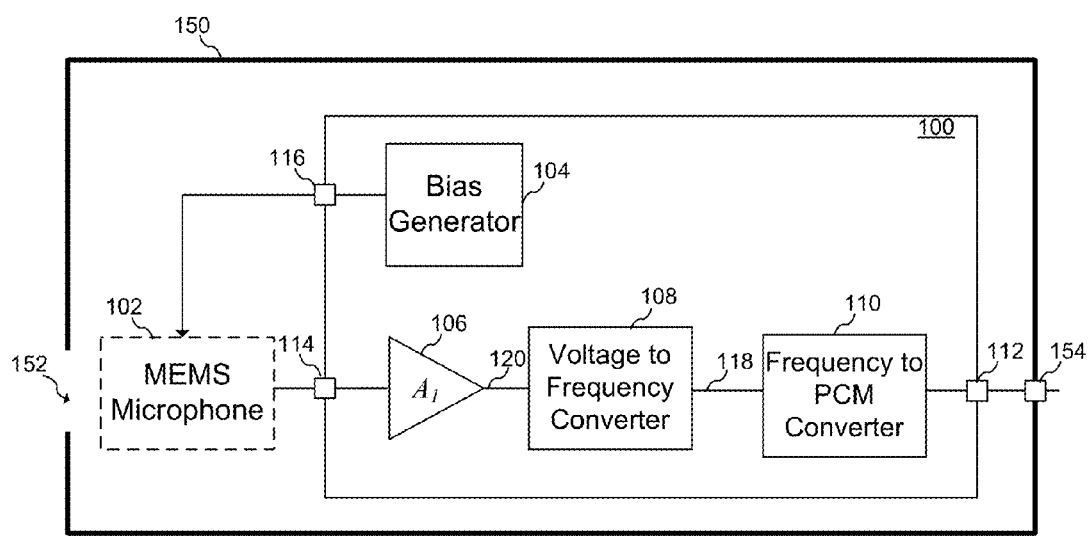
FIG. 7 illustrates an embodiment microphone module.

FIG. 7 illustrates a microphone module according to an embodiment of the present invention. If the microphone module includes IC 100 and coupled to MEMS microphone 102 as described in embodiments herein. Microphone 102 and IC 100 are disposed within package 150 with acoustic port 152 and PCM output port 154. In alternative embodiments of the present invention, IC 100 may be implemented using a different embodiment, for example IC 130 shown in FIG. 4a. In an embodiment, package 150 may be implemented using an acoustic enclosure in which a MEMS microphone is mounted on top of a printed circuit board (PCB) having a sound port, such as a hole. An application specific integrated circuit (ASIC) having embodiment circuitry, as described herein, is mounted next to the MEMS microphone. The resulting assembly is covered with a metal hood, which is sealed to the PCB in one embodiment. Alternatively, other package types may be used.

In accordance with embodiment, a method includes amplifying signal provided by a microphone to form an amplified signal. The method also includes converting the amplified signal into a frequency-based signal having a frequency dependent on an amplitude of the amplified signal. The frequency-based signal is converted into a pulse code modulated bitstream. In some embodiments, amplifying the signal provided by the microphone includes amplifying output of the MEMS microphone.

In an embodiment, converting the amplified signal into the frequency-based signal includes coupling the amplified signals to an input of a voltage controlled oscillator. In some embodiments, converting frequency signal into the pulse code modulated bitstream includes coupling frequency-based signal to an input of a sigma delta converter.

In an embodiment, a method includes amplifying a signal provided by a microphone to form an amplified signal, converting the amplified signal into a time-based signal having timing based on an amplitude of the amplified signal, and converting the time-based signal into a pulse code modulated bitstream. In some embodiments, amplifying the signal provided by the microphone includes amplifying an output of the MEMS microphone. In some embodiments, converting the amplified signal into the time-based signal includes coupling the amplified signal to an input of a pulse width modulator in some embodiments, converting time-based signal into the pulse code modulated bitstream includes coupling the time-based signal to an input of a sigma delta converter.

In accordance with a further embodiment, a circuit includes a voltage to frequency converter having an input configured to be coupled to a microphone, and a frequency to PCM converter having an input coupled to an output of the voltage to frequency converter. In some embodiments, the circuit also includes the microphone, which may be a MEMS microphone or other microphone types known in the art. In some embodiments, the voltage to frequency converter may be implemented using a voltage controlled oscillator, in the frequency to PCM converter may include a sigma delta converter.

In accordance with a further embodiment, a circuit includes a voltage to time converter having an input configured to be coupled to microphone, and a time to PCM for converter having an input coupled to an output of the voltage to time converter. In some embodiments, the circuit may also include a microphone, which may be committed using a MEMS microphone or other microphone type known in the art. In some embodiments, the voltage to time converter in the time to PCM converter are disposed on an integrated circuit. The voltage to frequency converter may include a pulse width modulator, and the frequency to time converter may include a sigma delta converter.

In accordance with another embodiment, a microphone module includes an acoustic enclosure, a microphone disposed within the acoustic enclosure, and an audio conversion circuit coupled to an output of the microphone. The audio conversion circuit may include a voltage to frequency converter coupled to the output of the microphone, and a frequency to PCM converter coupled to an output of the voltage to frequency converter. In some embodiments, the microphone module may also include an output port coupled to an output of the frequency to PCM converter. In some embodiments, the microphone may include MEMS microphone or other microphone type known in the art.

An advantage of embodiment systems includes the ability to generate a PCM signal from a microphone output using very little power consumption. Moreover, embodiment conversion techniques using, for example, a VCO, a pulsewidth modulator and/or a time to digital converter are advantageous with respect to silicon area and power consumption even at the cost of additional digital circuitry. This is because in small feature size CMOS (BiCMOC) technology the implementation of digital circuitry is very efficient in terms of both power dissipation and silicon area. Some embodiments are also advantageous in terms of high dynamic range and may achieve, for example, dynamic ranges of better than 100 dB.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
amplifying a signal provided by a microphone to form an amplified signal;
converting the amplified signal into a frequency-based signal having a frequency dependent on an amplitude of the amplified signal; and
converting the frequency-based signal into a pulse code modulated (PCM) bitstream using a sigma-delta converter, wherein the sigma-delta converter is configured to provide a PCM output code proportional to a frequency of the frequency-based signal, wherein the sigma-delta converter comprises a loop filter having a first input coupled to the frequency-based signal, a second voltage controlled oscillator (VCO) having an input coupled to an output of the loop filter, and a frequency-to-PCM circuit coupled to an output of the second VCO, and wherein an output of the frequency-to-PCM circuit is coupled to a second input of the loop filter.

2. The method of claim 1, wherein amplifying the signal provided by the microphone comprises amplifying an output of a MEMS microphone.

3. The method of claim 1, wherein converting the amplified signal into the frequency-based signal comprises coupling the amplified signal to an input of a first voltage controlled oscillator (VCO).

4. A circuit comprising:
a voltage-to-frequency converter having an input configured to be coupled to a microphone; and
a frequency-to-PCM converter having an input coupled to an output of the voltage to frequency converter, wherein the frequency-to-PCM converter comprises a sigma-delta converter, wherein the sigma-delta converter is configured to provide a PCM output code proportional to a frequency of a signal provided by the voltage-to-frequency converter, wherein the sigma-delta converter comprises a loop filter having a first input coupled to the input of the frequency-to-PCM converter, a voltage controlled oscillator (VCO) having an input coupled to an output of the loop filter, and a frequency-to-PCM circuit coupled to an output of the VCO, and wherein an output of the frequency-to-PCM circuit is coupled to a second input of the loop filter.

5. The circuit of claim 4, further comprising the microphone.

6. The circuit of claim 4, wherein the microphone is a MEMS microphone.

7. The circuit of claim 4, wherein the voltage-to-frequency converter and the frequency-to-PCM converter are disposed on an integrated circuit.

8. The circuit of claim 4, wherein:
the voltage-to-frequency converter comprises a second voltage controlled oscillator (VCO).

9. A microphone module comprising:
an acoustic enclosure;
a microphone disposed within the acoustic enclosure; and
an audio conversion circuit coupled to an output of the microphone, the audio conversion circuit comprising:
a voltage-to-frequency converter coupled to the output of the microphone, and
a frequency-to-PCM converter coupled to an output of the voltage-to-frequency converter, wherein the frequency-to-PCM converter comprises a sigma-delta converter, wherein the sigma-delta converter is configured to provide a PCM output code proportional to a frequency of a signal provided by the voltage-to-frequency converter, wherein the sigma-delta converter comprises a loop filter having a first input coupled to an input of the frequency-to-PCM converter, a voltage controlled oscillator (VCO) having an input coupled to an output of the loop filter, and a frequency-to-PCM circuit coupled to an output of the VCO, and wherein an output of the frequency-to-PCM circuit is coupled to a second input of the loop filter.

10. The microphone module of claim 9, further comprising an output port coupled to an output of the frequency-to-PCM converter.

11. The microphone module of claim 9, wherein the microphone comprises a MEMS microphone.

* * * * *